United States Patent
Motz

(10) Patent No.: US 6,825,709 B2
(45) Date of Patent: Nov. 30, 2004

(54) TEMPERATURE COMPENSATION CIRCUIT FOR A HALL ELEMENT

(75) Inventor: Mario Motz, Wernberg (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/337,193

(22) Filed: Jan. 6, 2003

(65) Prior Publication Data

US 2003/0128490 A1 Jul. 10, 2003

Related U.S. Application Data

(63) Continuation of application No. PCT/DE01/02440, filed on Jun. 29, 2001.

(30) Foreign Application Priority Data

Jul. 5, 2000 (DE) ............................................. 100 32 527

(51) Int. Cl.$^7$ ............................................. H01K 35/00
(52) U.S. Cl. ...................... 327/513; 327/539; 327/540; 327/541
(58) Field of Search ................................ 327/539, 540, 327/541, 543, 542, 544, 513

(56) References Cited

U.S. PATENT DOCUMENTS

| 4,705,964 A | | 11/1987 | Higgs |
| 4,760,285 A | * | 7/1988 | Nelson ........................ 327/511 |
| 4,833,406 A | | 5/1989 | Foster |
| 5,231,351 A | | 7/1993 | Kordts et al. |
| 5,260,614 A | | 11/1993 | Theus et al. |
| 5,349,286 A | * | 9/1994 | Marshall et al. ............. 323/315 |
| 5,406,202 A | | 4/1995 | Mehrgardt et al. |
| 5,510,699 A | * | 4/1996 | Theus et al. ................. 323/312 |
| 5,530,394 A | * | 6/1996 | Blossfeld et al. ........... 327/530 |
| 5,563,502 A | * | 10/1996 | Akioka et al. ............... 323/313 |
| 6,104,231 A | * | 8/2000 | Kirkpatrick, II ............. 327/513 |
| 6,107,866 A | * | 8/2000 | Migliavacca ................ 327/539 |
| 6,232,832 B1 | * | 5/2001 | Kirkpatrick, II ............. 327/560 |

FOREIGN PATENT DOCUMENTS

| EP | 0 450 910 A2 | 10/1991 |
| WO | 96/02849 A1 | 2/1996 |

OTHER PUBLICATIONS

Tietze et al.: "Halbleiterschaltungstechnik" [Semiconductor Circuit Technology], Ed. 10, Springer Verlag, 1993, p. 558.

* cited by examiner

Primary Examiner—Terry D. Cunningham
(74) Attorney, Agent, or Firm—Laurence A. Greenberg; Werner H. Stemer; Ralph E. Locher

(57) ABSTRACT

A temperature compensation circuit for a Hall element has a first and a second band gap reference circuit. The Hall element is fed from an excitation current that is proportional to a first reference voltage produced in the first band gap reference circuit. Furthermore, a second band gap reference circuit has a second resistor of a different resistor type than the first resistor. A second reference voltage is dropped across the second resistor. Inputs of a comparator are connected to the Hall sensor and to the second resistor. The comparator compares the Hall voltage with the second reference voltage. The present temperature compensation circuit automatically compensates for manufacturing-dependent and temperature-dependent tolerances.

12 Claims, 3 Drawing Sheets

TEMPERATURE COMPENSATION CIRCUIT FOR A HALL ELEMENT

CROSS-REFERENCE TO RELATED APPLICATION

This application is a continuation of copending International Application No. PCT/DE01/02440, filed Jun. 29, 2001, which designated the United States and was not published in English.

BACKGROUND OF THE INVENTION

Field of the Invention

The invention relates to a temperature compensation circuit for a Hall element for magnetic field measurement.

Hall sensors for magnetic field measurement must have a high precision. This is counteracted by the fact that temperature influences result in temperature dependencies, and discrepancies in manufacturing parameters result in manufacturing-dependent and technology-dependent discrepancies, which mean that Hall sensors having a digital output signal have discrepancies from the nominal switching points.

Various approaches are known for trimming out and for compensating for temperature-dependent or manufacturing-dependent tolerances.

An integrated Hall circuit with an adjustable operating point is specified in the U.S. Pat. No. 4,705,964. Adjustable resistors are provided for this purpose, and are formed by series circuits of resistance elements, with fusible links that are used to adjust the resistances. On one hand, complex measurement methods are required for this purpose, while on the other hand, the described principle occupies a large area on the chip surface and involves a high level of complexity for trimming.

Comparable trimming methods such as Zener zapping, laser fuses and laser trimming methods have similar disadvantages.

A temperature-compensated Hall effect sensor is specified in U.S. Pat. No. 4,833,406. In this case, a bipolar difference input stage is arranged at the output of the Hall element, for temperature compensation. However, there is a high degree of non-linearity in this case, which restricts the accuracy of the trimming process.

A compensated Hall sensor is specified in U.S. Pat. No. 5,260,614. In this case, at least two current sources form a compensating excitation current for supplying the Hall sensor. Complex circuitry is required to produce the excitation current for the Hall sensor.

A temperature compensation method for a Hall effect circuit is specified in Published European Patent Application EP 0 450 910 A2. In this case, a resistor is arranged in the same epitaxial layer as the Hall element, for temperature compensation. Because of the large number of series-connected base-emitter voltages, the circuit requires a high supply voltage, however, which amounts at least to the sum of three base-emitter voltages and a saturation voltage.

The principle of band gap reference is known from Tietze, Schenk: Halbleiter-Schaltungstechnik [Semiconductor circuit technology], 10th Edition, Springer Verlag 1993, page 558.

SUMMARY OF THE INVENTION

It is accordingly an object of the invention to provide a temperature compensation circuit for a Hall element which overcomes the above-mentioned disadvantages of the prior art apparatus of this general type.

In particular, it is an object of the invention to provide a temperature compensation circuit for a Hall element, which automatically compensates for manufacturing and temperature fluctuations and which is suitable for operation with low operating voltages.

With the foregoing and other objects in view there is provided, in accordance with the invention, a temperature compensation circuit for a hall element. The temperature compensation circuit has a first band gap reference circuit including a first resistor of a first resistor type, a Hall element for providing a Hall voltage, and a current mirror connecting the Hall element to the first resistor. The first resistor has a first resistance. A first reference voltage is dropped across the first resistance of the first resistor during operation. The current mirror feeds an excitation current into the Hall element. The excitation current is proportional to the quotient of the first reference voltage and the first resistance. The temperature compensation circuit also has a second band gap reference circuit including a second resistor of a second resistor type. A second reference voltage is dropped across the second resistor during operation. The temperature compensation circuit also has a comparator including inputs connected to the Hall sensor and to the second resistor for comparing the Hall voltage and the second reference voltage.

Providing two band gap reference circuits which use different resistor types has the advantage that it allows a magnetic field signal to be detected and digitized, independently of the technology, thus independently of the manufacturing parameters, and in a determined manner with respect to the temperature, without any additional trimming.

A further advantage of the present temperature compensation circuit is that it operates largely independently of the operating voltage of the temperature compensation circuit, and still functions at very low operating voltages.

If the temperature compensation circuit is intended to be used to produce a digital output signal, then the present circuit can be used to produce switching points that are largely independent of manufacturing and temperature parameters.

The first reference voltage, which is dropped across the first resistor, is transformed by the current mirror in the first band gap reference circuit to a supply voltage for the Hall element, and the supply voltage is proportional to the first reference voltage.

The first resistor may in this case be technologically coupled to the Hall element. For example, the first resistor may be arranged in the same epitaxial layer as the Hall element. The Hall element supply voltage that can be produced in this way is in consequence independent of the technology, since doping parameters and layer thickness discrepancies during manufacture are the same both in the first resistor and in the Hall element.

During production of the temperature compensation circuit, there is no need for temperature trimming or for sensitivity trimming.

In one advantageous embodiment of the present invention, the second band gap reference circuit has a third resistor, which is of the second resistor type, and is connected to the comparator in order to supply a third reference voltage that is dropped across the third resistor. There is a temperature coefficient that is approximately independent of the manufacturing technology between the second and the third reference voltages. Any desired voltage with any desired temperature coefficient and temperature profile can be produced independently of the technology by weighted adding or subtraction of the second and third reference voltages. The second band gap reference circuit can be used, for example, to produce switching points for comparators for digitally further-processing the Hall voltage signal.

Both the first and the second reference voltage are band gap reference voltages. These can be produced, for example, from the difference between two base-emitter voltages. These can be produced using two transistors that are operated with different current densities.

The third reference voltage may be a base-emitter voltage.

In a further preferred embodiment of the present invention, four transistors, which together form a feedback loop, are provided for producing the first reference voltage. The transistors are connected to a reference ground potential, to a supply potential and to the first resistor. The transistors are in this case connected such that a PTAT (proportional to absolute temperature) voltage is formed across the first resistor, which is connected to the emitter of the second transistor. The transistors are in this case connected to one another such that only in each case one base-emitter voltage or one threshold voltage of an MOS transistor is dropped between the supply potential and the reference ground potential, so that the circuit can be operated with a low supply voltage.

In a further advantageous embodiment of the present invention, the fourth transistor also forms a current mirror with a fifth transistor, which is connected to the Hall element.

The current mirror is used to mirror the current that is formed from the quotient of the first reference voltage and the first resistance, in order to supply an excitation current to the Hall element. This current mirror may have amplifying characteristics, so that the voltage that is dropped across the Hall element is amplified in comparison to the first reference voltage.

Instead of the fifth transistor, an amplifier circuit or current mirror circuit may be provided, which is designed such that a voltage is dropped across the Hall element and this voltage is proportional to a weighted product of the first reference voltage and a base-emitter voltage of a transistor in the band gap reference circuit. The factors may be weighted with weighting factors, which for example, can be adjusted by using the current mirror ratios.

In a further advantageous embodiment of the present invention, a second current mirror is connected to the second resistor, in order to output a second current, which is proportional to the second reference voltage.

In a further advantageous embodiment of the present invention, the third resistor is connected to the comparator such that the comparator can be supplied with a sum voltage of the second and third reference voltages, for comparison with the Hall voltage. The second and third reference voltages can in this case be weighted with weighting coefficients such that any desired temperature coefficient or complex higher-order temperature profiles can be achieved.

In a further advantageous embodiment of the present invention, the comparator is preceded by at least one operational amplifier to amplify the Hall voltage and the reference voltages.

While the first resistor and the Hall element are of a first resistor type, in which case both can be formed using the same semiconductor technology, and in particular, may have the same vertical structure, the second and third resistors are of a second resistor type, which is not the same as the first resistor type. The second and third resistors may, for example, be formed in a polycrystalline silicon layer, while the first resistor and the Hall element are in the form of an epitaxial or trench resistor.

The second and third resistors may be a diffusion resistor.

The amplifier may have MOSFET or JFET input stages. The gain of the amplifier can be adjusted via the resistance ratios and is therefore not influenced by the gradient of bipolar difference input stages and their non-linearity.

Other features which are considered as characteristic for the invention are set forth in the appended claims.

Although the invention is illustrated and described herein as embodied in a Temperature compensation circuit for a Hall element, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
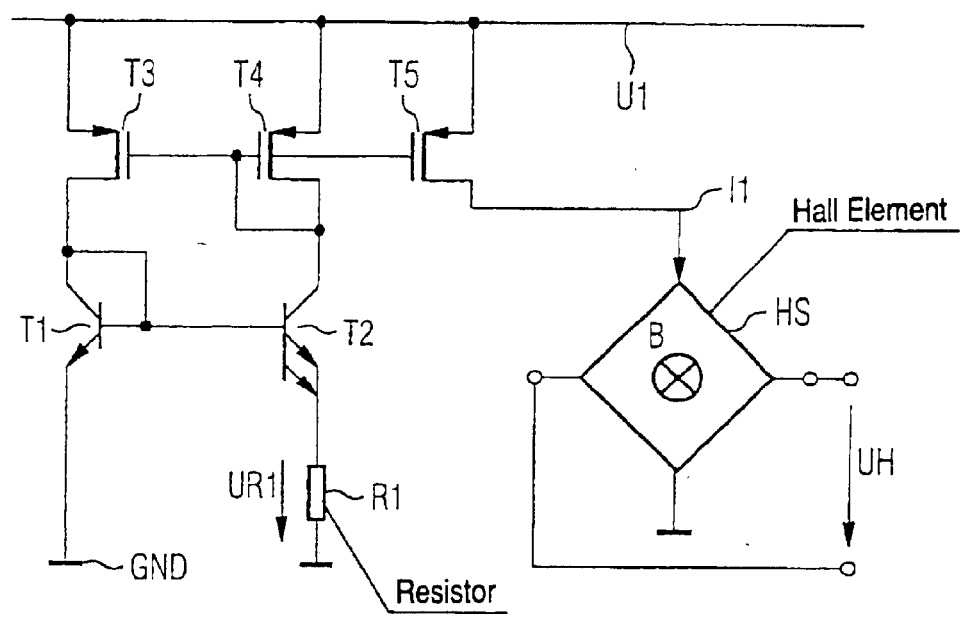
FIG. 1 is a schematic diagram of an exemplary embodiment of a first band gap reference circuit.

Referring now to the figures of the drawing in detail and first, particularly, to FIG. 1 thereof, there is shown a Hall element HS which operates as a magnetic field sensor and through which a magnetic field B passes. When the Hall element HS is supplied with an excitation current I1, then a Hall voltage UH can be tapped off in the direction at right angles to the magnetic field and to the excitation current. In order to make it possible to produce a Hall plate voltage UH which is independent of technology and manufacturing parameters, a first resistor R1 is provided, across which a reference voltage UR1 is dropped. A current mirror T4, T5 is connected to the first resistor R1; one connection of which is connected to a reference ground potential GND. The current mirror T4, T5 supplies the Hall element HS with a current, namely the excitation current I1, which is proportional to the quotient of the first reference voltage UR1 and the first resistor R1. The first reference voltage UR1 is a PTAT (proportional to absolute temperature) voltage, which is formed by the feedback network including the first to fourth transistors T1 to T4. A first and a second transistor T1, T2 are provided for this purpose, whose base connections are connected to one another. The first transistor T1 has a collector connection connected to its base connection, while its emitter connection is connected to a reference ground potential GND. Furthermore, a third and a fourth transistor T3, T4 are provided, which are in the form of MOS transistors whose gates are connected to one another and whose source connections are connected to a common first supply potential U1. The drain and gate connections of the fourth transistor T4 are connected to one another. The drain connections of the third and fourth transistors T3, T4 are connected to a respective collector connection of the first or second transistor T1, T2. The first resistor R1 is connected to the emitter of the second transistor T2.

The Hall voltage that is produced across the magnetic field sensor HS is calculated using the following formula:

$$UH = \frac{I1 * B * GH * rn}{n * q * d}.$$

The excitation current I1 is given by:

$$I1 = UR1 * GR * n * q * d * \mu n.$$

The first reference voltage UR1 is given by:

$$UR1 = \frac{k * T}{q}$$

The Hall voltage UH is given by:

$$UH = B * \frac{k*T}{q} * GH * GR * \mu n * rn;$$

where:

UH is the Hall voltage, B is the magnetic field, GH is a geometry factor relating to the Hall element, rn is the scattering factor, n is the doping, d is the thickness of the Hall element HS and of the first resistor R1, $\mu n$ is the mobility, GR is a geometry factor relating to the resistor R1, k is the Boltzmann's constant, T is the absolute temperature, and q is the element charge.

On the basis of the above derivation, the Hall voltage HS is independent of technology parameters such as the layer thickness d and the doping n of the Hall element HS. The mobility $\mu n$ and the scattering factor rn and their temperature coefficients are only slightly dependent on the doping.

Figure 2:
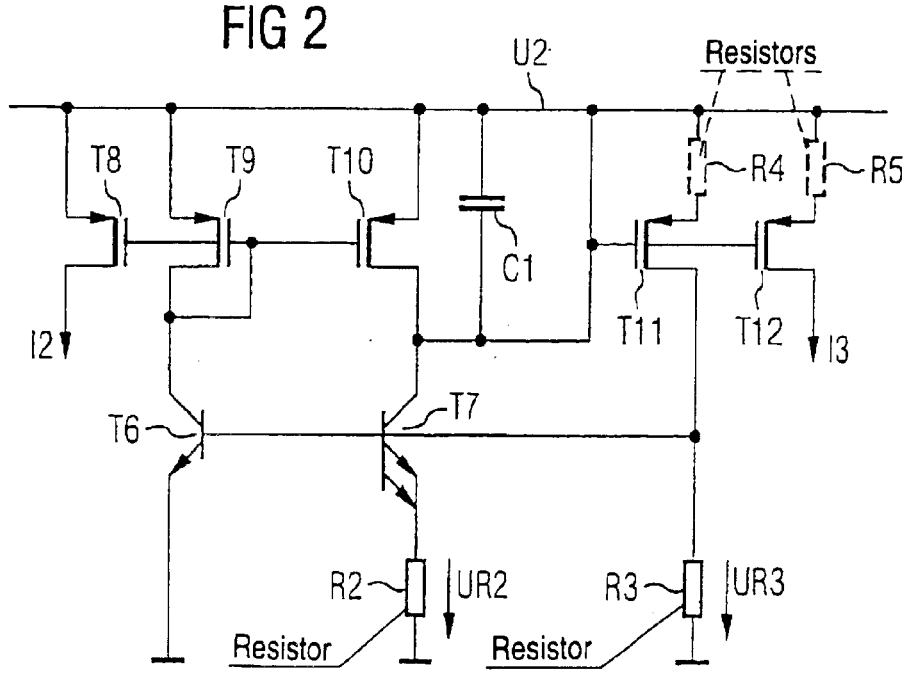
FIG. 2 is a schematic diagram of an exemplary embodiment of a second band gap reference circuit.

FIG. 2 shows an exemplary embodiment of the second band gap reference circuit. In this case, a second reference voltage UR2 is dropped across the second resistor R2, and a third reference voltage UR3 is dropped across the third resistor R3. A current I2 which is proportional to the second reference voltage UR2 is output from the second band gap reference circuit by using a current mirror that is formed by two MOS transistors T8, T9. A third current I3 that is proportional to the third reference voltage UR3 is output by using transistors T11, T12.

The second current I2 is proportional to the quotient of the second reference voltage UR2 and the second resistor R2, while the third current I3 is proportional to the quotient of the third reference voltage UR3 an the third resistor R3.

The MOS transistor T11 is at the same time used to regulate the base-emitter voltage that is dropped across the third resistor R3. This base-emitter voltage is the third reference voltage UR3. The MOS transistor T11 is also used to adjust the base potential for a sixth and seventh transistor T6, T7. For this purpose, the gate connection of an eleventh transistor T11 is connected via a first capacitor C1 to a second supply potential U2. Together with a ninth transistor T9, whose drain is connected to its gate, as well as a tenth transistor T10, whose gate is connected to the gate of the ninth transistor, and with the sixth and seventh transistors T6, T7, the eleventh transistor T11 once again forms a feedback loop. This feedback loop leads to the second reference voltage UR2 across the second resistor R2 being a PTAT (proportional to absolute temperature) voltage.

As can be seen, the circuits shown in FIG. 1 and FIG. 2 can be operated with very low supply voltages, since only a maximum of one base-emitter voltage or one threshold voltage, depending on the type of transistor, is in each case dropped between the supply potential U1, U2 and the reference ground potential GND.

Figure 3:
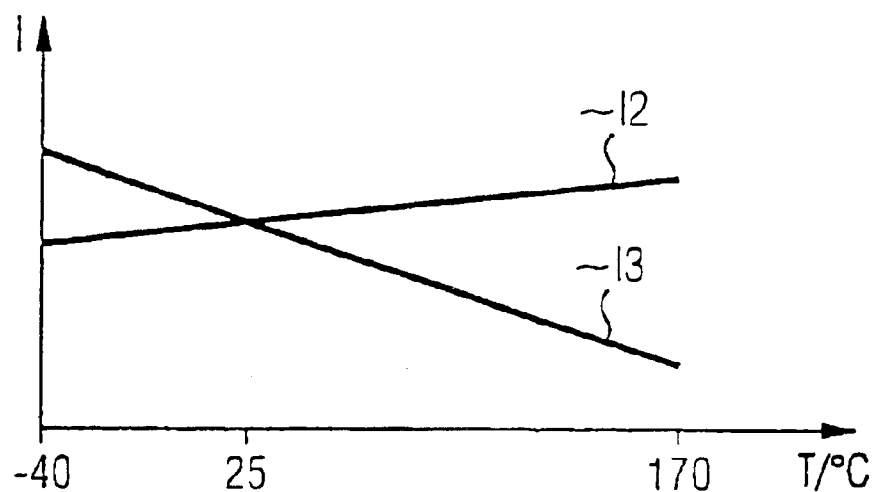
FIG. 3 is a diagram showing the temperature dependencies of the currents that are formed as functions of the second and third reference voltages.

FIG. 3 shows the temperature dependencies of the second and third currents I2, I3. As can be seen, the temperature characteristics of the second and third currents differ, so that any desired technology-independent temperature coefficients can be produced by weighted summation or subtraction.

Figure 4:
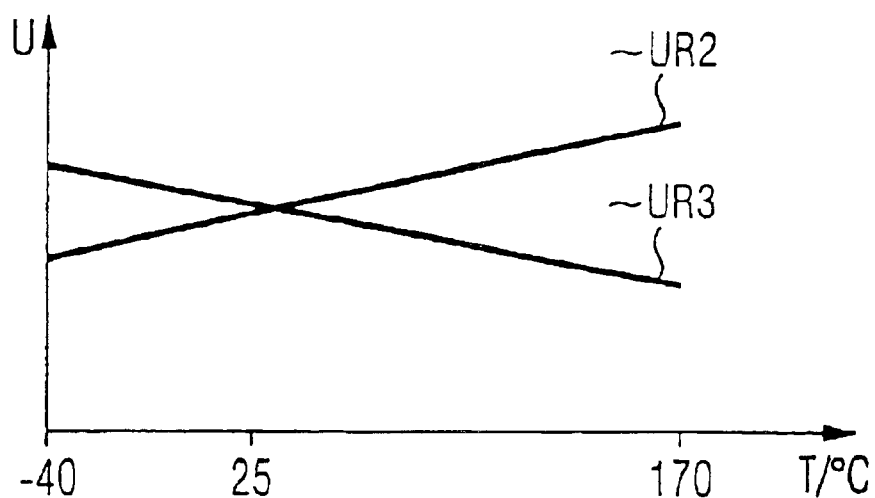
FIG. 4 is a diagram showing the temperature dependencies of the second and third reference voltages.

FIG. 4 shows the profiles of the second and third reference voltages UR2, UR3 plotted against the temperature T, and the second current I2 in FIG. 3 is proportional to the quotient of the second reference voltage UR2 and the second resistance R2. The third reference voltage UR3 is proportional to the product of the third current I3 and the third resistance R3.

While the first and second reference voltages UR1, UR2 are approximately independent of the technology, that is to say only second-order effects have any influence on the reference voltages UR1, UR2, the third reference voltage UR3 has only a third-order dependency on technology parameters. In consequence, all the other voltage drops that are produced across resistors are largely independent of the technology and are determined with respect to the temperature dependency, so that switching points with any desired, adjustable temperature coefficient can be set, independently of the technology.

Figure 5:
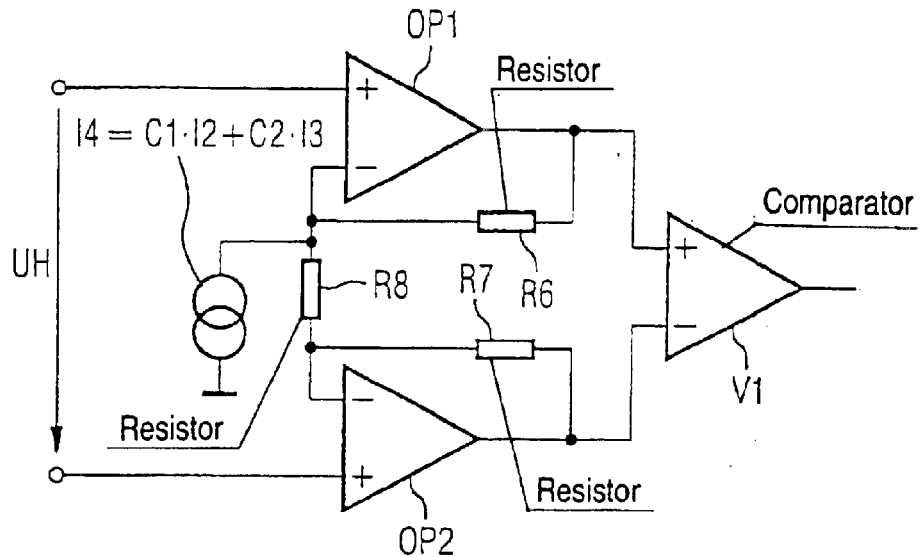
FIG. 5 is a schematic diagram of a first exemplary embodiment of a comparator circuit for digitizing the Hall voltage.

FIG. 5 shows a comparator V1, which is preceded by a first operational amplifier OP1 and a second operational amplifier OP2 such that the output of the first operational amplifier OP1 is connected to the non-inverting input of the comparator V1, and the output of the second operational amplifier OP2 is connected to the inverting input of the comparator V1. The first and second operational amplifiers OP1, OP2 each have negative feedback by way of respective resistors R6, R7. The Hall voltage UH from FIG. 1 can be applied between the non-inverting inputs of the operational amplifiers OP1, OP2. The inverting inputs of the operational amplifiers OP1, OP2 can be supplied first directly and second, via an eighth resistor R8, with a fourth current I4. The fourth current I4 is obtained from the sum of a first product and a second product. The first product is formed by multiplying a first constant C1 by the second current I2, and the second product is formed from a second constant C2 and the third current I3.

The switching threshold for the comparator V1 is calculated from a threshold voltage that is proportional to the sum of the product of the first constant and the second reference voltage UR2, and the product of the second constant and the third reference voltage UR3. Since the first and second constants C1, C2 as well as the currents I2, I3, which are proportional to the second and third reference voltages UR2, UR3 by mirror ratios, are subject to only minor technology fluctuations, the threshold voltage for the comparator V1 can be set very accurately and with a defined temperature characteristic.

Figure 6:
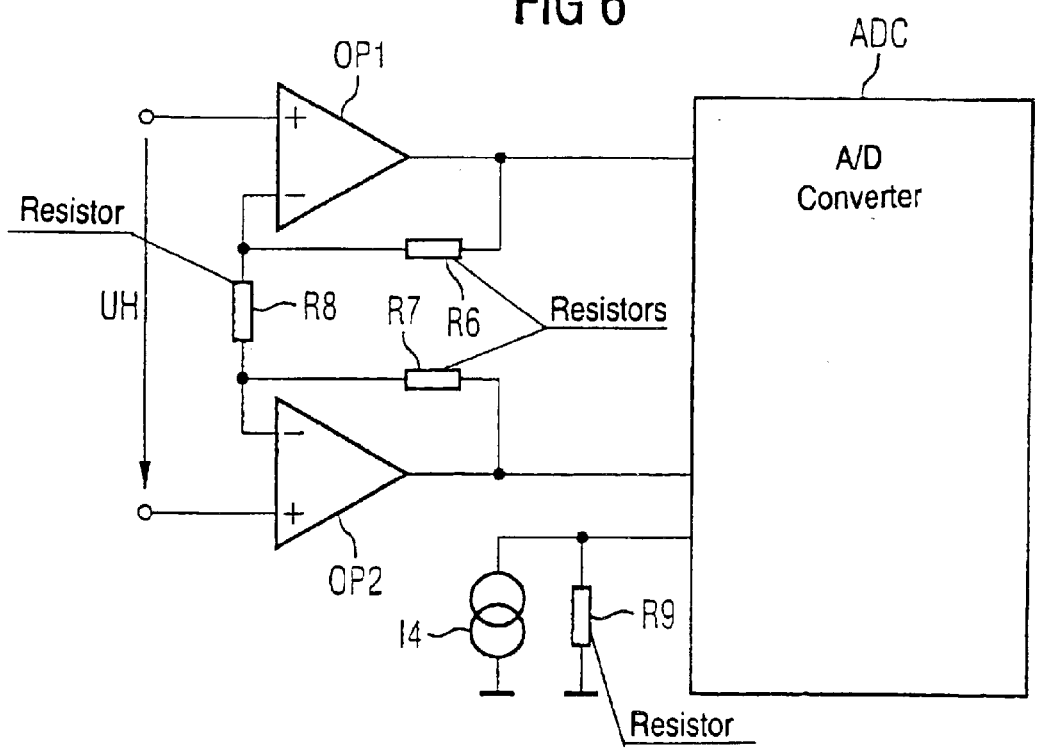
FIG. 6 is a second exemplary embodiment with an A/D converter for digitizing the Hall voltage.

FIG. 6 shows an alternate embodiment of the circuit shown in FIG. 5, with the comparator V1 being replaced by an analog/digital converter ADC. This differs from FIG. 5 in that the fourth current I4 cannot be supplied to the inverting inputs of the operational amplifiers OP1, OP2, but can be supplied directly to the analog/digital converter ADC via a ninth resistor R9. The ninth resistor R9 is of the second resistor type. A voltage threshold that is proportional to the fourth current I4 and that is used as a reference voltage for the analog/digital converter ADC is formed across the ninth resistor R9.

In an alternative embodiment, the comparator may be in the form of a sigma-delta converter that has an integrator.

The described embodiments have MOS transistors. These may be replaced entirely or partially by bipolar transistors, for example, pnp transistors.

Since the present temperature compensation circuit can be implemented in a current-saving form, with a low supply voltage, with a low surface area requirement, and with narrow tolerances, it is suitable, for example, for use in mobile radios.

I claim:

1. A temperature compensation circuit, comprising:
    a first band gap reference circuit including a first resistor of a first resistor type, a Hall element for providing a Hall voltage, and a current mirror connecting said Hall element to said first resistor, said first resistor having a first resistance, a first reference voltage being dropped across said first resistance of said first resistor during operation, said current mirror feeding an excitation current into said Hall element, said excitation current being proportional to a quotient of said first reference voltage and said first resistance;
    a second band gap reference circuit including a second resistor of a second resistor type, a second reference voltage being dropped across said second resistor during operation;
    said first resistor and said second resistor being of different resistor types for allowing detection of a magnetic field signal and facilitating temperature compensation; and
    a comparator including inputs connected to said Hall sensor and to said second resistor for comparing said Hall voltage and said second reference voltage.

2. The temperature compensation circuit according to claim 1, wherein:
    said second band gap reference circuit includes a third resistor of said second resistor type;
    a third reference voltage is dropped across said third resistor during operation; and
    said third resistor is connected to said comparator for supplying said third reference voltage thereto.

3. The temperature compensation circuit according to claim 2, wherein:
    said third resistor is connected to said comparator such that said comparator can be supplied with a sum voltage obtained from said second reference voltage and said third reference voltage; and
    said comparator is configured for comparing said sum voltage with said Hall voltage.

4. The temperature compensation circuit according to claim 2 comprising:
    at least one operational amplifier for amplifying said Hall voltage, said first reference voltage, and said second reference voltage;
    said operational amplifier preceding said comparator.

5. The temperature compensation circuit according to claim 2, wherein said first resistor and said second resistor are formed in a polycrystalline layer.

6. The temperature compensation circuit according to claim 1, wherein:
    for producing said first reference voltage, said first band gap reference circuit includes a first transistor, a second transistor, a third transistor, and a fourth transistor;
    said first transistor has a base connection, an emitter connection, and a collector connection;
    said second transistor has a base connection, an emitter connection, and a collector connection;
    said base connection of said first transistor is connected to said base connection of said second transistor;
    said collector connection of said first transistor is connected to said base connection of said first transistor;
    said emitter connection of said first transistor is connected to a reference ground potential;
    said first band gap reference circuit includes a third transistor and a fourth transistor;
    said third transistor has a gate connection, a drain connection, and a source connection;
    said fourth transistor has a gate connection, a drain connection, and a source connection;
    said gate connection of said third transistor is connected to said gate connection of said fourth transistor;
    said source connection of said third transistor and said source connection of said fourth transistor are connected to a common first supply potential;
    said drain connection of said fourth transistor is connected to said gate connection of said fourth transistor;
    said drain connection of said third transistor is connected to said collector connection of said first transistor;
    said drain connection of said fourth transistor is connected to said collector connection of said second transistor; and
    said first resistor is connected to said emitter connection of said second transistor.

7. The temperature compensation circuit according to claim 6, wherein the first band gap reference circuit comprises:
    a fifth transistor connected to said Hall element;
    said fourth transistor and said fifth transistor forming a first current mirror.

8. The temperature compensation circuit according to claim 1, wherein the second band gap reference circuit comprises a second current mirror connected to said second resistor; said second current mirror for outputting a second current proportional to said second reference voltage.

9. The temperature compensation circuit according to claim 1, wherein said Hall element is of said first resistor type.

10. The temperature compensation circuit according to claim 1, wherein said first resistor is an epitaxial resistor.

11. The temperature compensation circuit according to claim 1, wherein said first resistor is a trench resistor.

12. The temperature compensation circuit according to claim 1, wherein said second resistor is a diffusion resistor.

* * * * *